United States Patent
Warren et al.

(10) Patent No.: US 11,986,700 B2
(45) Date of Patent: May 21, 2024

(54) VIRTUAL SHIFTING FOR EXERCISE DEVICES

(71) Applicant: Zwift, Inc., Long Beach, CA (US)

(72) Inventors: Gary Warren, London (GB); Meir Machlin, Tel Aviv (IL); Adrian Bennett, London (GB)

(73) Assignee: Zwift, Inc., Long Beach, CA (US)

( * ) Notice: Subject to any disclaimer, the term of this patent is extended or adjusted under 35 U.S.C. 154(b) by 328 days.

(21) Appl. No.: 17/567,072

(22) Filed: Dec. 31, 2021

(65) Prior Publication Data

US 2023/0211208 A1 Jul. 6, 2023

(51) Int. Cl.
- A63B 24/00 (2006.01)
- A63B 22/06 (2006.01)
- A63B 71/06 (2006.01)
- G06F 30/20 (2020.01)

(52) U.S. Cl.
CPC ...... *A63B 24/0087* (2013.01); *A63B 71/0622* (2013.01); *G06F 30/20* (2020.01); *A63B 22/0605* (2013.01); *A63B 2071/0675* (2013.01); *A63B 2214/00* (2020.08); *A63B 2225/20* (2013.01)

(58) Field of Classification Search
CPC ............ A63B 24/0087; A63B 71/0622; A63B 22/0605; A63B 2071/0675; A63B 2214/00; A63B 2225/20; A63B 69/16; A63B 2024/009; A63B 2071/0655; A63B 2225/50; G06F 30/20
See application file for complete search history.

(56) References Cited

U.S. PATENT DOCUMENTS

| | | | | |
|---|---|---|---|---|
| 5,240,417 A | * | 8/1993 | Smithson | G05B 17/02 348/121 |
| 5,662,559 A | * | 9/1997 | Vasquez | A63B 22/16 482/61 |
| 7,682,286 B2 | * | 3/2010 | Badarneh | A63B 22/0605 482/64 |
| 9,278,249 B2 | * | 3/2016 | Watterson | A63B 21/0125 |
| 2002/0055422 A1 | * | 5/2002 | Airmet | A63F 13/245 482/61 |
| 2005/0209064 A1 | * | 9/2005 | Peterson | A63B 22/16 482/61 |
| 2013/0130798 A1 | * | 5/2013 | Nir | A63F 13/90 463/36 |
| 2015/0290490 A1 | * | 10/2015 | Badarneh | A63B 21/00192 482/57 |
| 2023/0082210 A1 | * | 3/2023 | Wennekes | A63F 13/25 434/255 |
| 2023/0241973 A1 | * | 8/2023 | Battlogg | B60T 1/08 188/267.2 |

* cited by examiner

*Primary Examiner* — Garrett K Atkinson
(74) *Attorney, Agent, or Firm* — SoCal IP Law Group LLP; Jonathan Pearce

(57) ABSTRACT

There is disclosed a system for engaging in exercise. The system includes a communications interface for receiving instructions from control software controlling operation of the exercise device, a resistance device for generating resistance to the exercise and applied to the exercise device, the resistance device for increasing or decreasing resistance for the exercise under control of the control software, and the control software operating to generate a simulated haptic movement, using the resistance device, by temporarily altering the resistance applied to the exercise device by the resistance device.

18 Claims, 9 Drawing Sheets

VIRTUAL SHIFTING FOR EXERCISE DEVICES

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to exercise systems and, more particularly, to a system for simulating the effect of bicycle gear shifting using a software-controlled flywheel.

Description of the Related Art

Indoor cycles and so-called "trainers" have been popular in various forms for more than thirty years. Trainers are devices added to another device (e.g., a bicycle) to provide resistance to the wheel, hub, cassette, or crank of the device. The earliest iterations were single-wheel bicycles including a separate large flywheel in place of what would typically be a back wheel (though often, they were mounted on the front) that relied upon the weight of the flywheel itself, as well as the manual application of resistance (e.g., an actual brake) to make indoor cycling challenging for a rider. These types of systems were quite rigid, required manual interaction to alter the exercise, and as a result were terribly boring. There were never gears to shift through, because they would be unnecessary. They feel almost nothing like riding a real bicycle outside over hills, through wind, and behind other riders.

Later, computer-controlled indoor cycles became popular in the late 1990s and early 2000 s. These systems were somewhat basic, but relied upon pre-recorded video of outdoor scenes paired with pre-determined resistance levels. The associated resistance could be manual, but in the more sophisticated bicycle-based systems, an electric (electromagnetic) brake attached to a bicycle or integrated into a stationary cycle was employed to provide resistance to an actual bicycle wheel or to a hub of the bicycle. Other systems using purpose-built indoor or stationary cycles may have only a single wheel, or may directly mount the pedal crank to the electric brake to provide resistance. Then, the system may be programmed to mimic the expected resistance to correspond to the pre-recorded video (e.g., it is more difficult to pedal up a hill than down it).

Other contemporary systems used computer graphics. At that time, the computer graphics were often quite basic, but a pixelated world may go by, or may be dynamically generated with hills and trees, while the computer simultaneously controls the resistance added by the electric brake. Some of these systems also enabled racers to compete within those game worlds. Some even used the internet to enable side-by-side competition across many physical miles of distance.

Serious outdoor cyclists strongly prefer riding on a familiar bike. When one is riding for hours at a time, many times a week, the familiarity of a particular cycle or cycles is important. In addition, using a familiar bike helps to maintain a suspension of disbelief while engaging in an online interactive game like the Zwift® software provides. As a result, many riders who use software like Zwift rely upon trainers, as opposed to purpose-built stationary cycles, that are mounted to a given rider's bicycle (or an older bicycle that was once used outdoors, but is not any longer).

However, one of the significant downfalls of reliance upon such trainers is that it is a chore to remove the back wheel and to properly mount the rest of the bicycle to the trainer. The preferred method for mounting is removal of the back wheel, and replacement of the bicycle cassette with a trainer-specific cassette onto which the chain is mounted. That process is not difficult, but it is time-consuming, and cumbersome (e.g., holding the bike steady, while mounting it, then releasing tension on the chain while winding it on the trainer cassette). In addition, the trainer cassette gearings may not match those preferred by the rider and/or used on the rider's cycle when riding outdoors. So, reliance upon that cassette may not be ideal. A given cyclist may feel that the need to purchase a separate cassette for use specifically with the trainer adds additional expense on top of an already-expensive hobby or exercise option.

For a busy rider who simply wishes to get into a ride as quickly as possible, all of the foregoing are impediments that impose limitations on easy entry into Zwift® software generally, and into use of a trainer specifically.

Throughout this description, elements appearing in figures are assigned three-digit reference designators, where the most significant digit is the figure number and the two least significant digits are specific to the element. An element that is not described in conjunction with a figure may be presumed to have the same characteristics and function as a previously-described element having a reference designator with the same least significant digits.

DETAILED DESCRIPTION

The process of removing a cassette, wheel, and axle from a bike, then adding a separate axle, cassette and trainer apparatus is complicated and time-consuming. It acts as a barrier or impediment to a rider beginning exercise using a bicycle of their choosing. It would be beneficial if there were a simpler method to attach a trainer that did not result in loss of the function of shifting gears or changing gears while operating the bicycle and trainer combination in a game or in a simulated cycling world or in training classes provided for real cycling scenarios (as opposed to things like spinning classes). As discussed below, a single point of attachment has many benefits, but removes the opportunity for a rider to use gears while riding. Virtual shifting solves this problem.

Description of Apparatus

Figure 1:
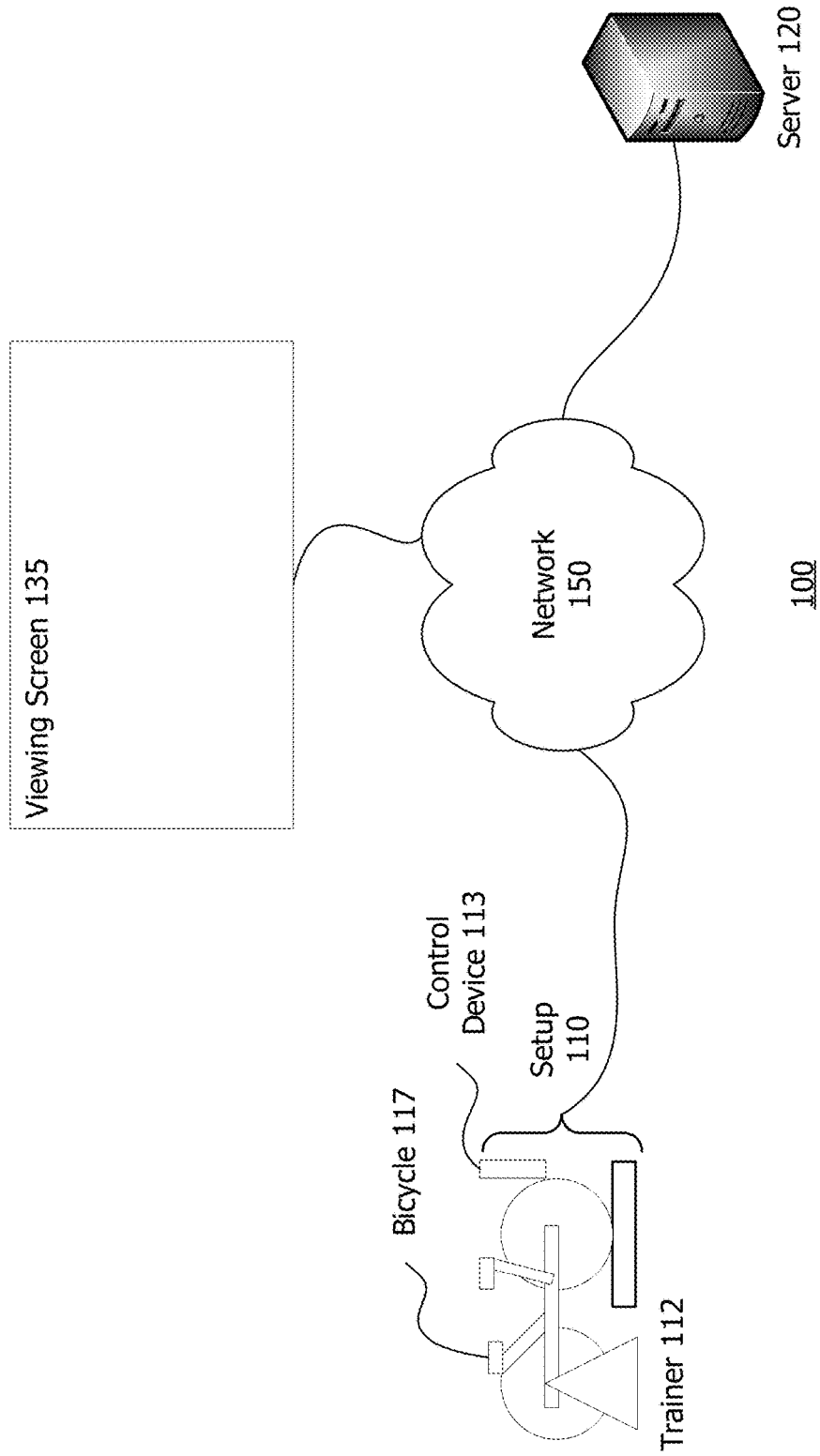
FIG. 1 is an overview of a system for virtual shifting.

FIG. 1 is an overview of a system 100 for virtual shifting using a software-controlled flywheel. The system 100 includes a representative setup 110, including a bicycle 117 and a trainer 112, which may be connected by a network 150 to a server 120. A viewing screen 135 may be used by the setup 110 or by a spectator or other viewer. A single setup 110 is shown, but multiple setups may be used by multiple individuals, who may or may not be present in the same location.

The trainer 112 is a device connected to an exercise device to provide resistance to exercise using that exercise device. That resistance may be manual (e.g., a fixed or manually-adjustable brake), but in the most modern cases, trainers like trainer 112 are computer-controlled electric brakes. Preferably, the resistance device is an electric (electromagnetic) motor, but other types of electronically-controlled motors or resistance devices may be used (e.g., an electronically controlled fan brake). The most typical trainer 112 is for a bicycle, such as bicycle 117 shown in FIG. 1. However, similar trainers 112 or devices for enabling computer-controlled resistance to exercise may be applied to rowers, indoor cycles, outdoor cycles, stair steppers, elliptical machines, resistance-based weight machines, or other exercise devices.

The resistance device is called a "resistance" device though it may provide power to a hub or axle. The only variable is whether that power is in opposition to or in conjunction with an exercising individual. In cases in which that power is applied against the rider, runner, or operator; then that is "resistance." Examples include trainers, indoor cycles or rowing machines. In cases in which that power is applied to assist a rider, runner, or operator; then that resistance device acts as extra power or to assist the rider, runner, or operator. Examples include e-bikes and treadmills.

The trainer 112 typically attaches in place of a back wheel of the bicycle. The trainer 112 incorporates a stand to cause the bicycle to stand upright, and to provide appropriate support to enable the bicycle 117 to be used for riding while in a fixed position. The typical attachment is a hub-mounted clamp-style system that sits over the axle bolt and nut. Other "quick mount" systems enable a handle to open and close a clamp around the axle bolt and nut so as to more quickly lock the trainer 112 in place taking the position of the wheel. Other systems simulate a typical axle bolt themselves, and incorporate bolts and/or nuts or a quick-release handle that dynamically expands and contracts to firmly mount the trainer 112 to the bicycle in place of a rear wheel.

Still other systems may directly interact with the rear wheel while it remains attached to the bicycle. Those systems tend to "slip" more and are disfavored by serious cyclists using indoor trainers. Though the virtual shifting capabilities are certainly possible with such systems, they are disfavored for purposes of this discussion because they are more likely to slip.

The control device 113 may be or include computing devices which are programmed to control the associated setup 110. The control device 113 may be or include a display screen for, for example, displaying a game world, virtual world, and/or information regarding the workout (e.g., wattage, speed, total distance, information about upcoming changes in the workout or resistance applied, etc.). The control device 113 is shown as a single device, but may be multiple devices, such as a computing device, and a separate display or so-called smart TV that acts as both. In some cases, the control device 113 may be or include Apple® iPads or Android® tablet personal computing devices or other displays. In other cases, the control device 113 may be integrated with a display. Regardless, the control device 113 operates to adjust the resistance or power supplied by the resistance device in response to signals it generates (e.g., following a predetermined workout routine) or that it receives from other devices, such as the server 120. The control device 113 may rely upon the server 130 (discussed below) or may operate entirely independently of the network 150 on a stand-alone basis.

The bicycle 117 may be a typical bicycle. In most cases, the bicycle 117 will be of a type used by road bicyclist riders. These bicycles are typically very light with strong frames, small tires meant for reducing road friction, and handlebars designed to support a rider hunched over the handlebars for extended periods of time on a long ride. In most cases, the bicycle 117 will have its back tire removed for purposes of allowing it to integrate with the trainer 112. Most of these integrations involve removal of the back wheel, but retaining the cassette, or a trainer-mounted replacement cassette may be used, to which the pedals of the bicycle 117 are linked via a chain. A tensioner may be employed to reduce slack in the chain, much as they are with most geared bicycles.

The server 120 may connect to the control device 113 through a network 150 (discussed below). The server 120 may be a persistent online multiplayer game server that enables users to engage in exercise with one another. In such a case, the server 120 will serve a location (e.g., within the game world), information about other users and associated graphics and avatars to a user of that software, while the user's control device 113 provides to the game server 120 information about the user's speed, power, cadence, and the like. The Zwift® software is one such virtual game world that operates as a server that connects to client software on the control device 113. The server 120 may instruct the control device 113 to alter the resistance applied by a resistance device, for example, in view of a virtual avatar climbing up a hill or descending a hill, so that the resistance matches the exertion necessary for a user's avatar in the virtual game world.

Alternatively, the server 120 may not operate a game at all. The server 120 may be a server that enables users to engage in exercise classes remotely from their homes or other locations using indoor or outdoor cycles, rowers, or other exercise apparatus. In such a case, the game server 120 may provide instruction to the control device 113 to alter the resistance applied by a resistance device as directed by a class instructor. That instruction may be provided over the network 150 and may be directed or controlled (at least partially) by a class instructor.

Still further alternatively, the server 120 may simply be a source of a routine or exercise instruction that is partially or wholly automated. In such a case, a user may be engaging in an exercise routine that is programmatically created or pre-created by a human, and that a user may progress through while the server 120 actively controls the resistance (or power) applied at each part or the server 120 provides an entire program that alters the resistance (or power) applied throughout an exercise routine.

The viewing screen 135 is a display for showing some or all of the game world and/or exercise routine details and/or performance statistics to a user or users. The viewing screen 135 may be present either for multiple users (e.g., in a group class) or for a single user (e.g., as a display under the direction of the control device 113). For example, a group class may be presented with information about the exercise routine and their performance in the routine as it progresses. In another example, a user of the indoor cycle 112 may see an on-screen avatar moving through a virtual game world on the viewing screen 135 as directed by the control device 113. The network 150 may or may not be involved in that communication, depending on the relative location of the control devices (nearby or over the internet) and the situation (group class, online race, or a single individual exercising outdoors or in his or her gym). Multiple viewing screens may be used, one by each user and/or one in each location.

The network 150 is a communications system that enables communication of data between the control device 113, the server 120, and, potentially, the viewing screen 135. The network 150 may be or include the internet. However, the network 150 may include 802.11x wireless networks, Bluetooth®, and ANT+ connections, as well as other wireless protocols. The network 150 may also include wired connections such as ethernet.

Figure 2:
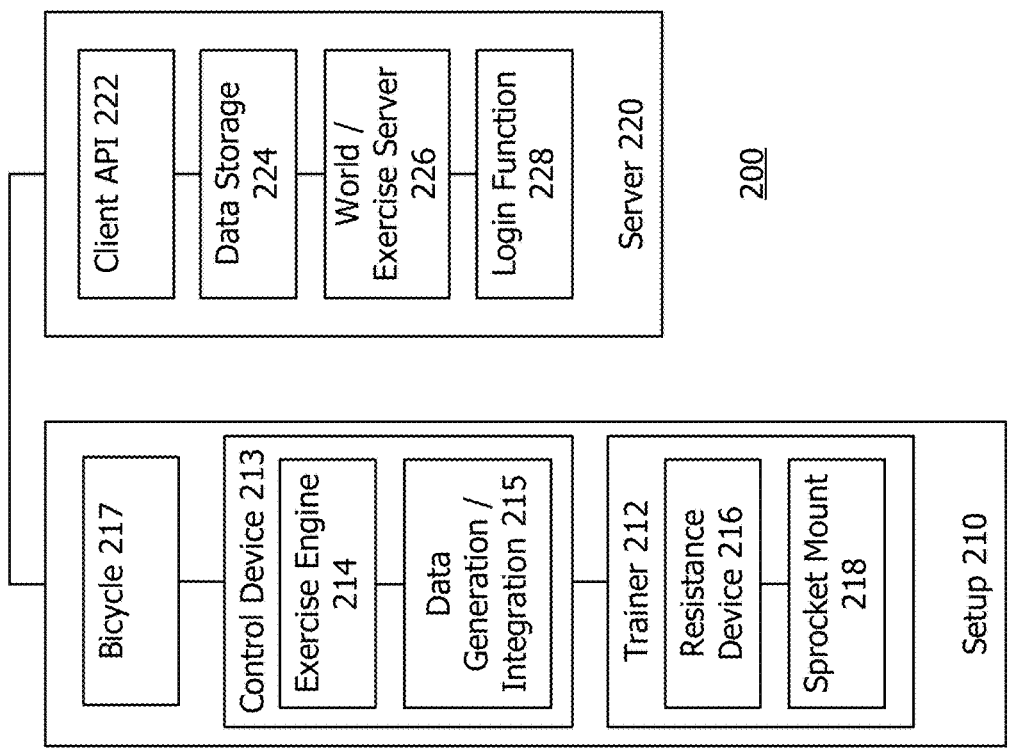
FIG. 2 is a block diagram of a system for virtual shifting.

FIG. 2 is a block diagram of a system 200 for virtual shifting using a software-controlled flywheel. The system 200 includes setup 210, which itself includes a trainer 212, a control device 213, and a bicycle 217. The system 200 also includes a server 220.

The setup 210 includes a trainer 212 which itself includes a resistance device 216 and a sprocket mount 218. As discussed above, the trainer 212A is a resistance device that mounts to a wheel, a hub (e.g., on the cassette) or an axle of a bicycle intended to operate as an outdoor cycle. Once connected, the trainer 212 operates as an electrically controlled brake on the wheel, axle or hub to thereby provide resistance to pedaling by a rider of the bicycle. The setup 210 preferably includes the bicycle 217 as well.

The resistance device 216 that is a part of the trainer 212 operates to provide resistance in response to direction of the control device 213 and/or server 220. The trainer 212 is preferably an electrically controlled brake, but other types of resistance are also used such as friction brakes, air brakes, and rollers. The resistance device 216 provides the primary function of a trainer 212, but trainer 212 may also include one or more computing devices (FIG. 3) and wired or wireless communications systems that send and receive signals with the control device 213 and respond with more or less resistance being provided to an attached bicycle 217.

The sprocket mount 218 will be discussed more fully below, but preferably is a single-cog cassette that is designed in such a way that it may be easily and quickly affixed and removed from a bicycle hub. More than one cog may be used, but one is preferred because it enables the trainer to be thinner, and makes connection and integration with an existing chain of the bicycle much easier. The additional cogs are unnecessary because of the virtual shifting provided by the system as discussed more fully below.

The setup 210 also includes a control device 213 which includes an exercise engine 214 and data generation/integration 215 which are combined hardware and software components that perform instruction under the direction of the control device 213 and the server 220. The exercise engine 214 is software, operating on a computing device (FIG. 3) that is or is a part of the control device 213. The exercise engine 214 enables exercise to take place as directed by a software program (e.g., a game), a workout video, a remote teacher or class, or some other computer-controlled exercise regimen. The exercise engine 214 may store computer models, computer graphical textures, maps, settings, and animations as well as the software itself that enable the exercise regimen to take place using the trainer 212 at the direction of the control device 213. One such game is the Zwift® software, for example, operating on a control device that may be an Apple® iPad. Alternatively, the exercise engine 214 may connect to a remote streaming service to stream live or archived classes, or to obtain or take part in an exercise regimen controlled by the control device 213.

The exercise engine 214 may operate to enable the virtual shifting functionality described herein under the direction of the control device 213 and/or the server 220. In particular, the exercise engine 214 may control operation of the trainer 212 to mimic gear shifting while the trainer 212 incorporates a single, physical cog, to better simulate outdoor riding of a bicycle, while enabling less complex hardware, and a simpler integration between the trainer 212 and the bicycle 217.

The data generation/integration 215 is software and/or hardware the interacts with the trainer 212 to obtain or capture data about the exercising rider of the associated cycle. That data may include the power level the rider is cycling, the speed at which the associated trainer is turning, and any changes in those data inputs. The data generation/integration 215 obtains that information from the trainer 212, generates associated signals and data that is provided over a network to the game server 220 to enable the exercise engine 214 to function. The data generation/integration 215 also interacts with the exercise engine 214 upon receipt of data from the game server 220 to show to a given rider in a game world or to show progression or statistics related to the exercise regimen on the screen and/or store those statistics in the control device 213 or an associated device (e.g., a Stray a-enabled mobile application or Apple® watch).

Much of the foregoing regarding setup 210 is discussed with reference to a game world. However, the "game world" may not exist in some implementations as discussed above. In such cases, the exercise engine 214 may simply be a system for delivering an exercise routine or class to a user, and the game server 220 may be a server that provides that routine or class. Data generation/integration 215 serves much the same function, enabling interaction with the server 220 and capturing and providing data from the trainer 212 to the server 220 and from the game server 220 to the exercise engine 214. That data may be captured and provided to the server 220 in real time, as it is created, or may be stored until a given routine or class is completed. Likewise, a given routine or class may be provided by the server 220 to the control device 213 in real time or prior to beginning the class or routine, depending on the particular implementation.

Though much of the foregoing is discussed with reference to trainer 212, an indoor cycle may also incorporate virtual shifting. Such an indoor or stationary cycle may not have need of a sprocket mount, as it is a bicycle designed for indoor or stationary cycling. But, an indoor cycle may function much the same as a trainer 212 and bicycle 217 combination with respect to implementing virtual shifting in software. Specifically, a resistance device integral to such an indoor cycle may be a computer-controlled motor for providing resistance or providing power to the indoor cycle. The resistance device is preferably an electric motor that may operate on direct current (e.g., batteries) or convert alternating current to direct current. For the indoor cycle or the trainer 212, signals may be sent by the exercise engine 214 or the server 220 or both to cause the trainer to simulate virtual shifting as discussed more fully below.

Still other exercise devices may utilize the systems and methods described herein. These could be or include treadmills, ellipticals, rowers, or other exercise devices. Even outdoor cycles and other outdoor exercise devices may incorporate these systems and methods.

The server 220 is a computing device (and may be many computing devices) that includes a client API 222, data storage 224, a world/exercise server 226, and a login function 228. The server 220 is a computing device running software that enables the functions discussed herein. The server 220 may be implemented in whole or in part as hardware or software.

The client API 222 is an application programming interface that enables sharing of data and communication from the game server 220 with other devices (e.g., the control device 213) and vice versa. The client API 222 enables the control devices 213 to connect with the game server 220 to implement the game world and/or the exercise routines or other controls for resistance. The client API 222 may pass data back and forth and accept data sent to it from authorized sources.

The data storage 224 is preferably a database operating on the game server 220 that stores data. The data stored therein may be game data files for the game server 220 to operate, but may also include data about ongoing exercise (e.g., speeds, locations, power being applied, etc.) for exercisers who are engaged with the game server 220 using the trainer 212 or an indoor cycle and other similar devices. The data storage 224 may retain historical records and statistics for users.

The world/exercise server 226 is a server software that operates on the server 220 to enable the exercise engine 214 to present a game world to a rider, user, or exercising individual. As discussed above, this may be a game world like Zwift® with in-game avatars and exercise taking place simultaneously with many users. Alternatively, the world/exercise server 226 may instead be a service from which exercise classes are obtained, or exercise routines are downloaded (or connected to in real-time). The world/exercise server 226 may take many forms, but it is a server service to which the control device 213 (and others) can connect to enable interaction with one another. And, data provided by the world server 226 may be used by the control device 213 (and others) to adjust the resistance based upon data passed between devices using the client API 222 (e.g., a rider is on a hill, so the resistance should be increased or the class is in a sprint section, so resistance should be increased, etc.).

The login function 228 enables users of the control device 213 to connect to the server 220 to engage in exercise or otherwise download or upload data.

Figure 3:
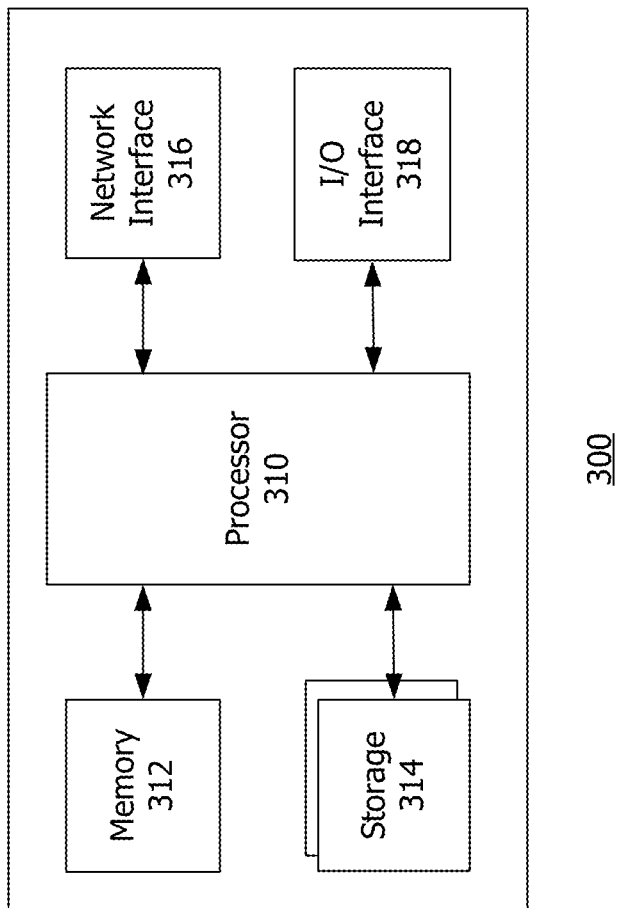
FIG. 3 is a functional diagram of a computing device.

Turning now to FIG. 3, a block diagram of a computing device 300 is shown. The computing device 300 may be representative of the server computers, client devices, mobile devices and other computing devices discussed herein. The computing device 300 may include software and/or hardware for providing functionality and features described herein. The computing device 300 may therefore include one or more of: logic arrays, memories, analog circuits, digital circuits, software, firmware and processors. The hardware and firmware components of the computing device 300 may include various specialized units, circuits, software and interfaces for providing the functionality and features described herein.

The computing device 300 may have a processor 310 coupled to a memory 312, storage 314, a network interface 316 and an I/O interface 318. The processor 310 may be or include one or more microprocessors and application specific integrated circuits (ASICs).

The memory 312 may be or include RAM, ROM, DRAM, SRAM and MRAM, and may include firmware, such as static data or fixed instructions, BIOS, system functions, configuration data, and other routines used during the operation of the computing device 300 and processor 310. The memory 312 also provides a storage area for data and instructions associated with applications and data handled by the processor 310. As used herein, the word memory specifically excludes transitory medium such as signals and propagating waveforms.

The storage 314 may provide non-volatile, bulk or long-term storage of data or instructions in the computing device 300. The storage 314 may take the form of a disk, tape, CD, DVD, SSD, or other reasonably high capacity addressable or serial storage medium. Multiple storage devices may be provided or available to the computing device 300. Some of these storage devices may be external to the computing device 300, such as network storage or cloud-based storage. As used herein, the word storage specifically excludes transitory medium such as signals and propagating waveforms.

The network interface 316 is responsible for communications with external devices using wired and wireless connections reliant upon protocols such as 802.11x, Bluetooth®, Ethernet, satellite communications, and other protocols. The network interface 316 may be or include the internet.

The I/O interface 318 may be or include one or more busses or interfaces for communicating with computer peripherals such as mice, keyboards, cameras, displays, microphones, and the like.

Figure 4:
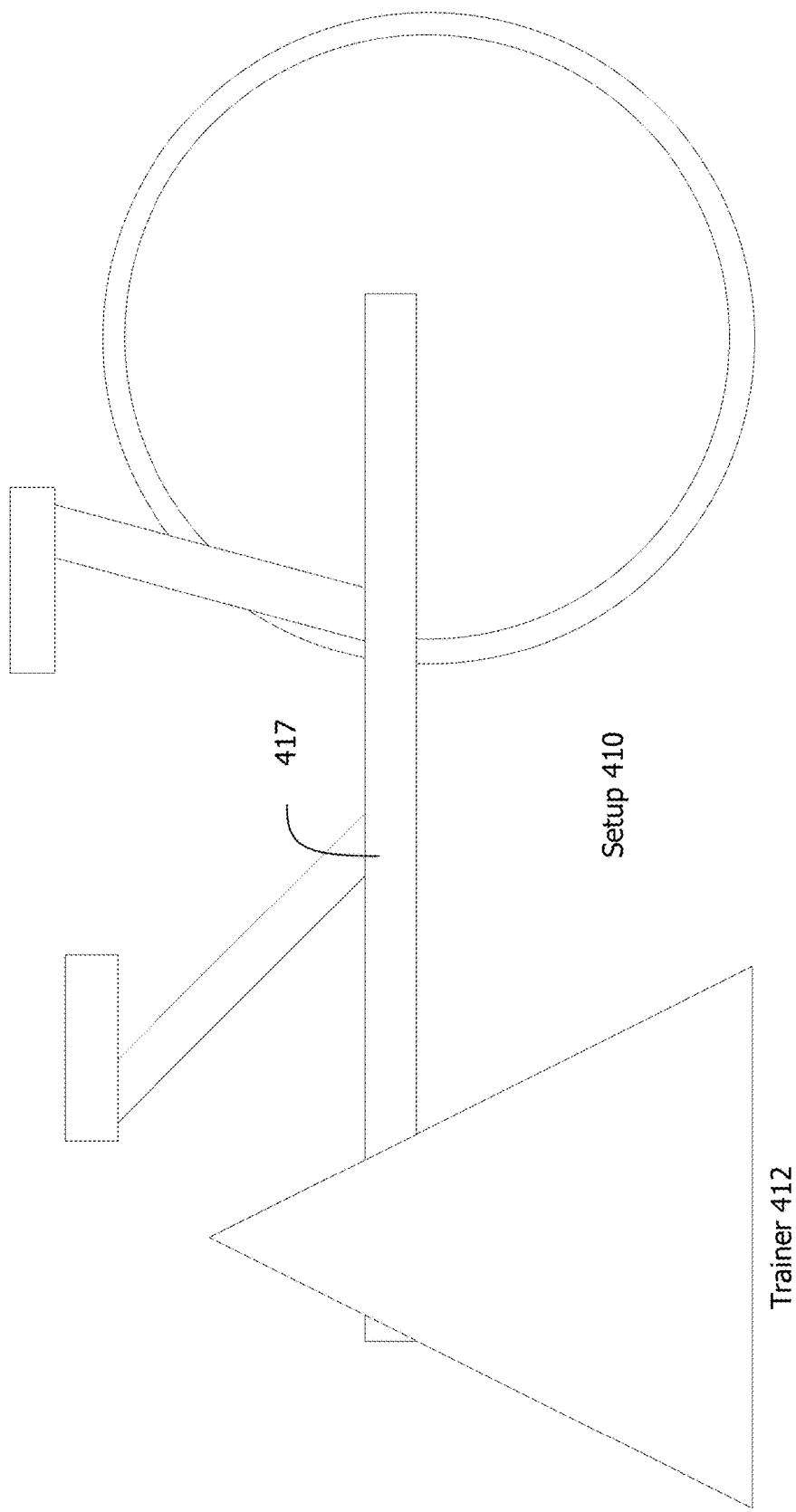
FIG. 4 is an example of a setup including a trainer and bicycle.

FIG. 4 is an example of a setup 410 including a trainer 412 and bicycle 417. The setup 410 is shown with the bicycle 417 linked to a trainer. Here, the back wheel has been removed, as is typical, but trainers may be used with the back wheel still mounted.

Figure 5:
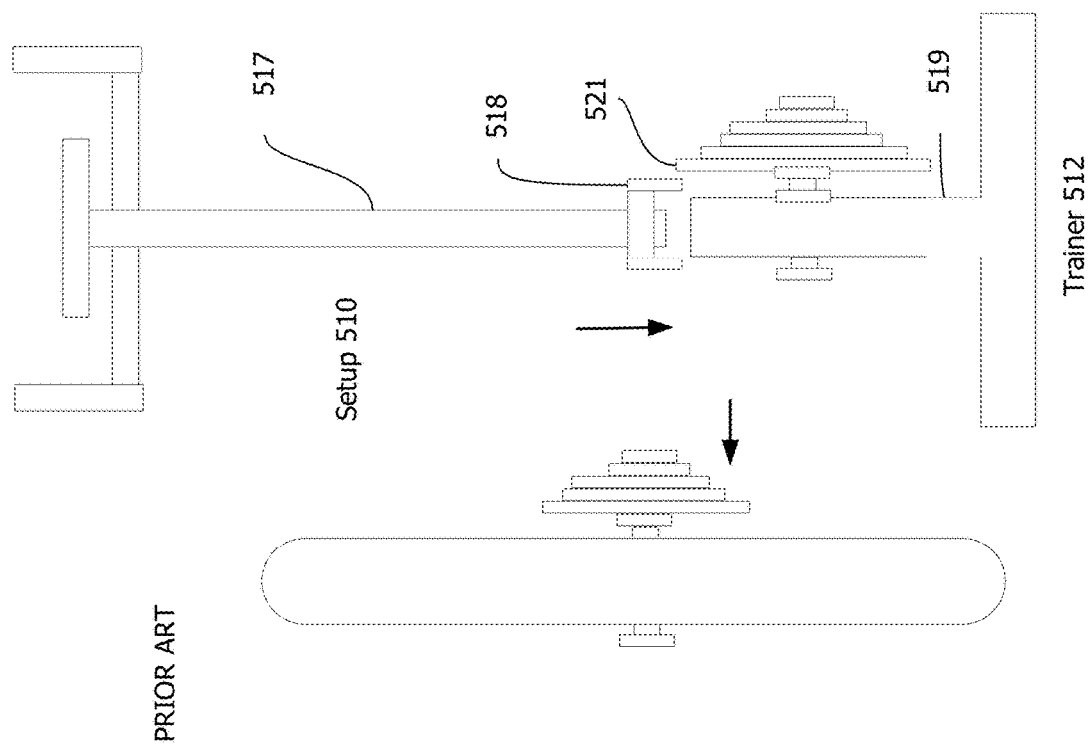
FIG. 5 is an example of a prior art trainer and bicycle employing an independent cassette.

FIG. 5 is an example of a prior art trainer 519 and bicycle 517 employing an independent cassette 521. The bicycle 517 has its rear wheel removed so that the axle may be reached. As indicated above, some trainer systems do not require removable of the back wheel, but this arrangement is typical. Here, the trainer 519 incorporates its own cassette to enable the bike to continue having gears when the trainer is integrated into the bicycle 517. This cassette 521 is shown right (from the rear) of the bicycle 517 frame, but other arrangements are possible, for example, with support on the left of the back wheel (facing the front of the bike) and the cassette 521 on the right. The particular arrangement of the cassette 521 is somewhat immaterial.

In practice, the trainer 512 is mounted to a back axle 518 of the bicycle 517. The trainer 512 replaces the back wheel and/or entire back axle 518. In either case, the trainer 512 incorporates a cassette 521 because that is a part of the back wheel hub which is removed in this process. An axle (shown as still integrated with the removed wheel and replaced with a specific axle used only by the trainer 512, but which may remain in some cases) is mounted to the new cassette 521. The base 519 may provide support for a rider operating the trainer.

In integrating the bicycle 517 with the trainer 512, the rider must loop the chain around the cassette 521 for the overall system to function. The replacement of the cassette 521 for a purpose-built one is cumbersome. This added step requires setting a riding bicycle's gear shifters to the lowest possible gear (smallest cog), then placing the chain on the corresponding smallest cog. From time to time, the gearings are quite different, and the derailleur must be adjusted to account for the gearings of the replacement cassette. The gear shifter may not have the same number or same placement of gears. A separate cassette that matches the gearings on the back wheel that is replaced by this trainer may have to be purchased and fitted to the trainer 512. All together, this can create quite a cumbersome process for a rider.

Figure 6:
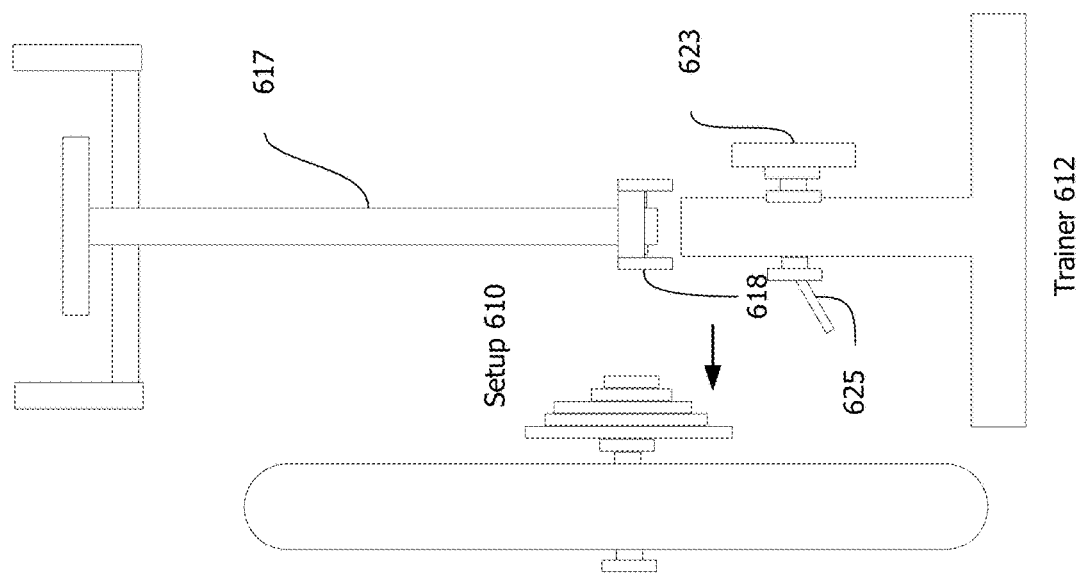
FIG. 6 is a single sprocket based trainer and bicycle.

FIG. 6 is a single-sprocket 623 based trainer 612 and bicycle 617. The same wheel and cassette have been removed as with the prior art systems shown in FIG. 5. However, a specially designed axle 618 may be fitted. This axle has a single sprocket (cog) on its right side (other sides may be used in some cases). Preferably a single sprocket is used, but a pair of corresponding sprockets, or a unique setup or shape of object to be inserted into the sprocket receiver 625. The primary purpose of the sprocket 623 is that it provides a unique, and relatively small, surface, so that a corresponding sprocket receiver 625 of the trainer 612 can accept the sprocket 623 for easy mounting and dismounting of the trainer 612.

The sprocket 623 is described as a single sprocket, but it may be two sprockets, or numerous sprockets to connect a chain onto sprocket 623 and the trainer 612. The sprocket 623 may simply be a typical cassette with numerous cogs or a special sprocket with only two or three cogs. However, the system described herein intended for virtual shifting may be used with such a sprocket 623 in a single gear. Manual shifting is unnecessary and, in fact, may hinder the capabilities of the trainer 612 and associated system to accurately generate resistance, virtual shifting, virtual braking, and to perform the other functions of the overall system. As understood herein the single sprocket 623 is one that is intended for use as the only sprocket for use with the virtual shifting system described herein, whether or not there are two or more cogs on a given cassette on which the sprocket 623 is mounted. The sprocket 613 may be implemented as a traditional through axle or using a quick release axle. If the sprocket 623 is internal to the trainer in some cases, then a suitable cutout of the front of the trainer 612 may be used to enable the chain to pass through the trainer 612 when the bicycle 617 is in operation with the trainer 612.

One of the major benefits of using the single sprocket and virtual shifting system described herein is that a group of riders with different desired gearings, bikes, etc. need not alter cassettes or trainers while riding. Or, a single rider with different setups for different scenarios (e.g. endurance racing versus sprint racing) can have those virtual cassettes implemented in software using this system, rather than having to manually swap cassettes and/or bikes on a trainer.

A quick release 625 lever may compress the axle of the trainer 612 or the axle of the bicycle 617 so that the sprocket 623 is held securely in place during operation of the bicycle 617 and trainer 612 combination. The same quick lock lever 625 may be moved in an opposite direction to release the trainer 612 to enable quick and easy transition of the bicycle 617 back to a road bike through reintroduction of the back wheel and standard cassette.

An alternative approach involves the use of an axle permanently fixed within the trainer. The axle itself may be mounted, as is typical for wheels, to the rear fork. This may be secured with nuts or with a common quick-release lever. Once mounted, the trainer itself may take the place of the wheel and cassette entirely. However, such a mounting system is less favored because the axle may be more prone to slipping, relative to the fork, than the combined chain and sprocket configuration. Any slippage is more likely to cause mechanical problems or, at a minimum, to feel less like actual shifting when the virtual shifting systems are employed as discussed below.

As discussed more fully below, the use of a single sprocket is enabled by the introduction of virtual shifting. The reason most trainers incorporate a cassette is because most trainers replace the back wheel. Riders are accustomed to shifting up and down gears as they go up and down hills, attempt to pass other riders, or use a downhill section to gain even more speed. Removing the cassette altogether has been disfavored because a single-gear bike feels remarkably unnatural to an experienced rider. The complete removal of the gears makes strategic decisions about stamina, strength, and race timing or even the concept of sprints quite boring and one-dimensional to an experienced rider.

Furthermore, modern trainers are remarkably capable of simulating even very minor changes in resistance like those of transitions between gearings. The use of a particular gear may also be simulated just as drag, friction, grade, wind, drafting, and other characteristics may be simulated by a trainer and a computing device (e.g., controller 213). So, the need for a cassette is somewhat of an anachronism where virtually every other aspect of a virtualized ride or exercise class (e.g., spinning class) is simulated. Given that the large cassette on a trainer introduces so much hassle for transitioning from road to indoor cycle, virtual shifting and the single sprocket system for mounting and dismounting trainers present a significant change and advance to ease of use and overall rider experience.

Description of Processes

Figure 7:
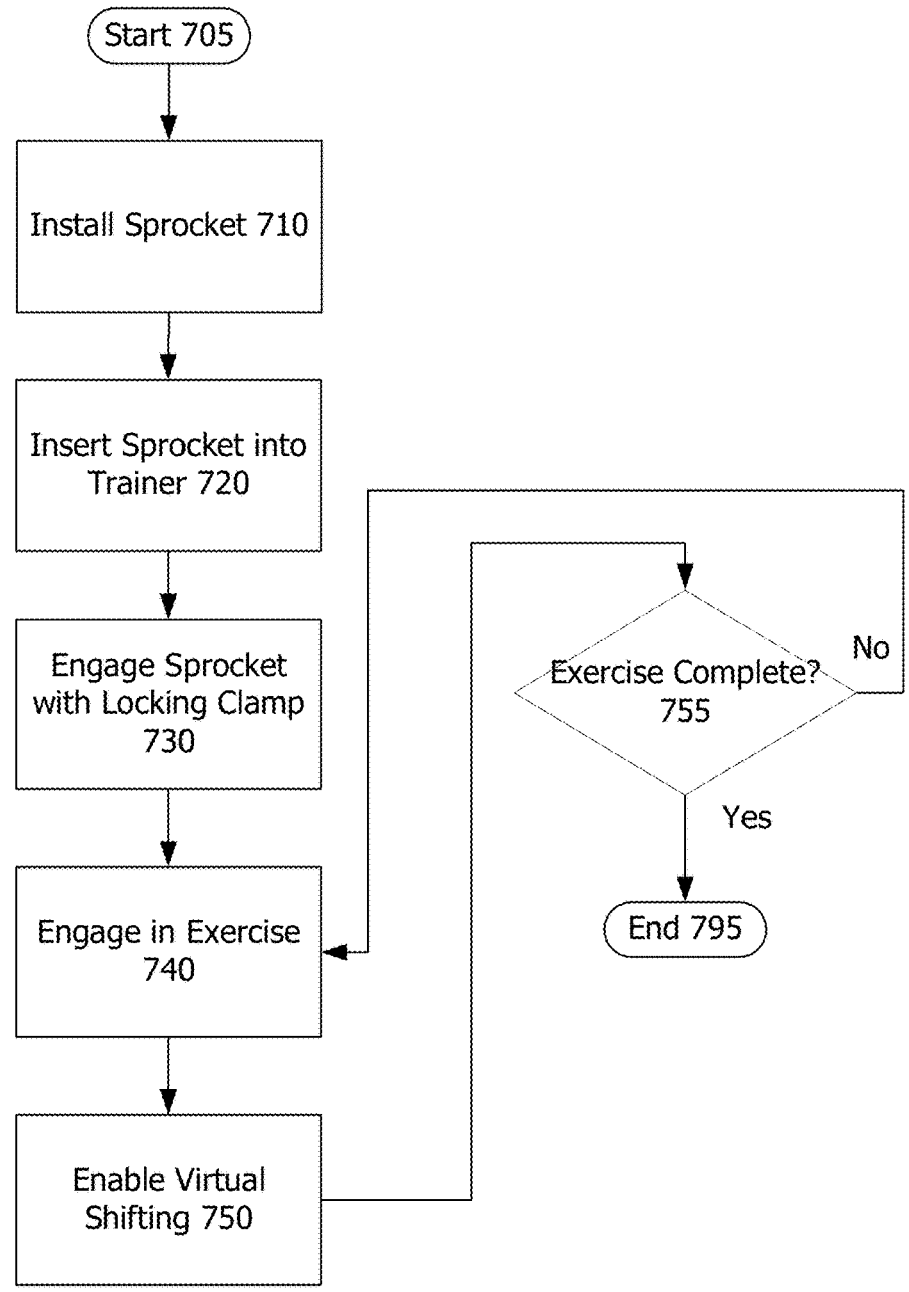
FIG. 7 is a flowchart of a method of mounting to and using a single sprocket based trainer with a bicycle.

Turning now to FIG. 7, a flowchart of a method of mounting to and using a single sprocket-based trainer with a bicycle is shown. The flowchart begins at 705 and ends at 795, but the single sprocket trainer may be installed, uninstalled, and reinstalled any number of times as desired by a rider.

Following the start 705, the process begins with installation of the sprocket at 710. This step assumes that a user has already removed the back wheel from the bicycle. Installation of the sprocket preferably involves insertion of a special-purpose axle into the rear fork of a bicycle. The axle includes a sprocket on its right side (preferably, but not required) and a separate cog for use with the bicycle's chain. The special-purpose axle may include two exposed bolt ends suitable for a standard-width (or various widths) fork, and may be shipped with traditional nuts for securing the axle to the frame. Alternatively, a quick-attach, quick-release lever, as is known in the art, may be used on one or both sides of the axle to secure it to the fork and frame.

Next, at 720, the sprocket is inserted into the trainer at 720. This step involves integration of the sprocket with the trainer. Preferably, the sprocket and sprocket receiver are designed so that they integrate specifically and securely with one another. A five-tooth cog is one example of a secure, unlikely to slip, and strong type of sprocket form which the sprocket may take. A three-sided cog is another option. The sprocket receiver is formed as a special-purpose counterpart to whatever sprocket form is selected. At this step 720, that sprocket is inserted into the sprocket receiver.

Next, at 730, the sprocket is engaged with a locking clamp within the sprocket receiver. Preferably, this is a quick-release lever that, when closed, causes the locking clamp to compress the sprocket receiver uniformly around its circumference to engage the sprocket equally on all sides or equally with all teeth of an associated cog. This quick-release lever system ensures that the trainer may easily be removed and reinstalled without significant effort by the rider.

Thereafter, and because these are the only steps required, the rider may engage in exercise at 740. This engagement may be taking part in an online game involving the use of bicycles and trainers with the trainer providing resistance according to instructions provided by the game. As a part of that, the trainer may provide virtual shifting functionality since the sprocket has no gearing whatsoever. That exercise may be merely riding the cycle and trainer combination. That exercise may be taking part in a class or otherwise engaging with a streamed or pre-recorded class session or one created by a computer or a person using a computer that is sent to the control device 213 (FIG. 2) for the bicycle.

The control device 213 (FIG. 2) and the associated trainer 212 acting together may enable virtual shifting at 750 as a part of that exercise. That shifting may simulate the "feel" of shifting as discussed more fully below. In particular, that simulation may be both for (1) the different levels of resistance associated with higher or lower gears on a bicycle in different situations and (2) the quick loss of power and resumption of power at a different rate, often with some clicks and snaps in between, while shifting gears. This will be discussed more fully below.

The system may automatically detect attachment of the sprocket through the use of a unique sensor on the trainer and unique axle. Alternatively, a rider may inform the associated software (e.g., Zwift®) that a single sprocket trainer system is being used. This information may be used to enable operation of the virtual shifting and cause the server 220 (FIG. 2) to instruct the control device 213 to provide associated signals to the trainer to simulate virtual shifting. If the single sprocket trainer is not detected, or no setting is set in the associated software, then virtual shifting may not be enabled, and the system may rely upon typical cassette systems or provide no virtual shifting at all.

Next, a determination is made whether exercise is complete at 755. If the exercise is not complete ("no" at 755"), then the process continues with more engagement in exercise at 740.

If the exercise is complete ("yes" at 755), then the process ends at 795. Though, a user could reinitiate the process to use the single sprocket system for subsequent exercise. The easy on and off of the system enables the rider to use the same bicycle for both indoor and outdoor sessions.

Figure 8:
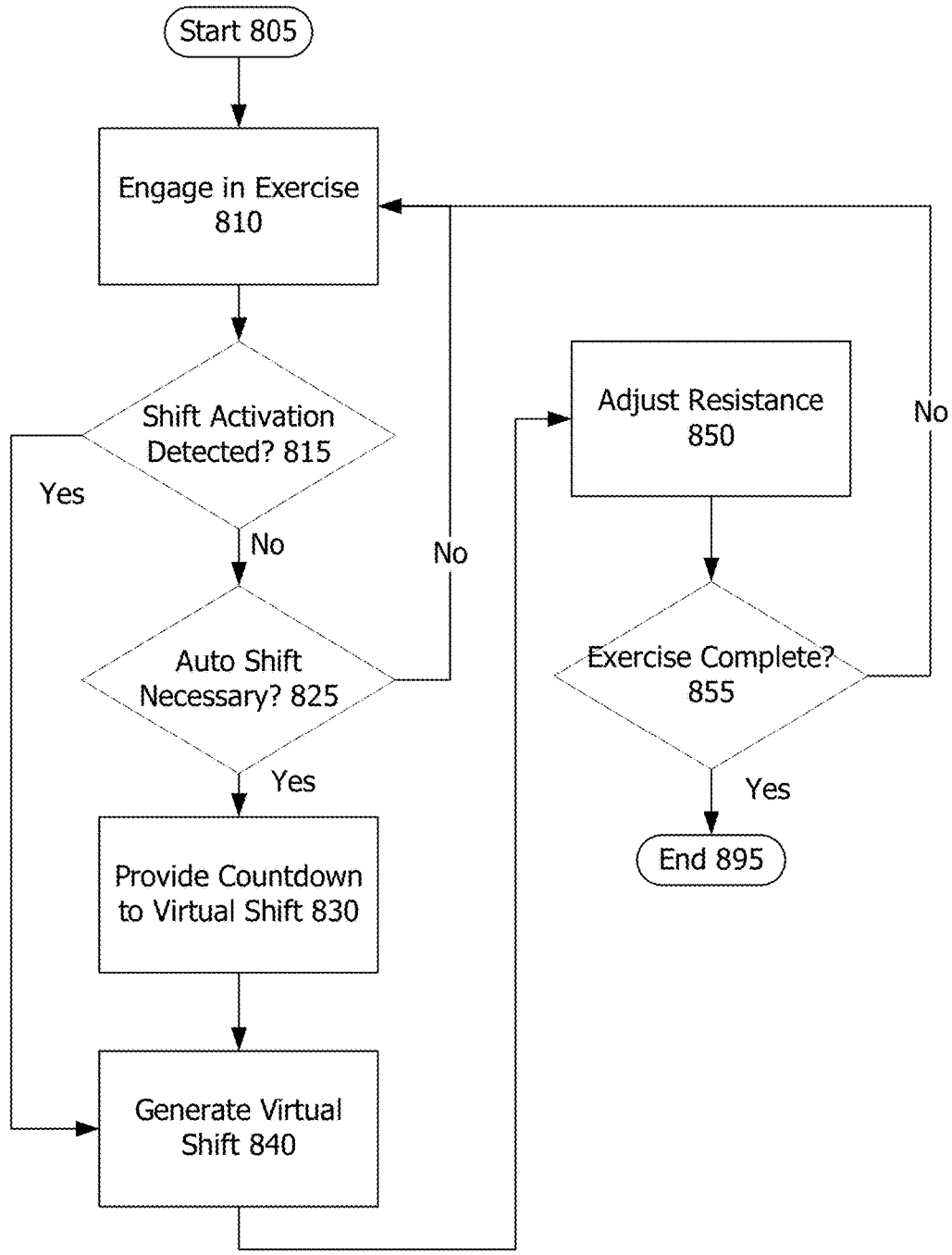
FIG. 8 is a flowchart for a method virtual shifting using a software-controlled flywheel.

FIG. 8 is a flowchart for a method virtual shifting using a software-controlled flywheel. The flowchart begins at 805 and ends at 895, but may continue indefinitely as exercise is taking place.

Following the start at 805, the process begins with engagement in exercise. This could be the engagement at 740 and 750 of FIG. 7. However, while the use of a bicycle/trainer combination is discussed significantly in this application, the virtual shifting is possible with a fully-integrated stationary cycle or indoor cycle. The virtual shifting becomes particularly important if a single sprocket trainer system is used, so as to simulate shifting without a physical cassette. However, to minimize the components, size, and expense of manufacturing a stationary cycle, a physical cassette may not be used at all, with an indoor cycle directly employing a resistance mechanism as its "back wheel" or by otherwise directly linking the pedal crank to a resistance device that can implement the virtual shifting as discussed herein.

Following commencement of the exercise at 810, a determination is made whether a shift activation is detected at 815. The phrase shift activation here is used to denote a shift made through action of a rider. This is not necessarily the activation of a derailleur through the use of cables and wires, though it may be in some cases using visual or physical detection of that process. In other cases, it may merely be the activation of a button (e.g., a video game controller button or similar button). However, in cases involving a trainer/bicycle combination with the single sprocket, electromagnetic sensors may be added to hand controls for the derailleur or to the physical derailleur so that the control device 213 (FIG. 2) may be provided information regarding the position of the physical gear shifters. Since the derailleur will not actually function to move the chain up or down gears since there is a single gear (preferably), the electromagnetic sensors may be integrated into or affixed to the exterior of gear shifters to detect movement of the physical gear shifters and, thereby, to send a signal to initiate gear shifts.

Alternatively, an indoor cycle or purpose-built bicycle/trainer combination may incorporate a controller or controllers that include a button or buttons or levers or model shifters that very much appear like actual gear shifters. That controller or controllers may include one or more buttons and the like that generate signals to the control device 213 to cause gears to shift up or down. Those signals may be detected at step 815 as "shift activation" even though they are merely button presses or movement of levers that are designed to imitate physical gear shifters.

In addition, the "gears" of the virtual shifting may be user settable. So, in a typical case of an outdoor cycle, a rider may have a desired set of gears for a cassette. Serious and professional riders may individually select each gear. Similarly, the use of virtual shifting may enable a rider to precisely control the size of each gear in the virtual cassette using an on-screen user interface or in-game settings. A typical cassette may be simulated by default, but a rider may tune a desired gear set to be whatever is desired. Importantly, this does not require the purchase of any additional hardware since all of the gears are simulated in software using the same trainer capability to adjust the resistance applied to the bicycle pedals with the electric motor.

If a shift activation is detected ("yes" at 815), then the process continues at 840, which will be discussed more fully below.

If a shift activation is not detected ("no" at 815), then the process continues to 825.

At 825, a determination is made whether an auto-shift is necessary. An auto-shift may be a method that is implemented by the control device 213 to enable auto shifting in situations in which a typical rider would down- or up-shift. For example, as a rider begins an "uphill" climb in a virtual world like Zwift®, a typical rider would shift to a higher gear (increasing the size of the cog, and thereby lowering the power necessary to turn that cog a certain amount) to climb the hill. Though this example is with respect to Zwift®, other riders shift gears in other contexts (e.g., virtual rides, trained classes, etc.).

An auto-shift may be necessary in general, or may simply be a setting that may be set by a rider so as to lower the number of things about which a rider must keep his or her mind upon while riding. However, auto-shift may be particularly necessary if a given rider does not have gear shifters, does not have the electromagnetic sensors (or other sensors—visual, RFID, etc.), and does not have a controller to actuate shifting. In either case, the system may detect that a down- or up-shift would be beneficial to the rider here (e.g., the pedal cadence has significantly increased or decreased, a typical rider in this location has pedal cadence significantly increase or decrease, or a typical rider does shift into this gear or that gear at this location or at this point in the exercise). In such a case, the auto-shift functionality may be necessary ("yes" at 825).

The auto-shift may also be intelligent in a number of ways. For example, a given rider's cadence may be detected as not decreasing or increasing or, as shown below, the countdown may need to start well ahead of an upshift or downshift so that the virtual gear shift happens when the rider needs it, not with a significant delay. So, the software may intelligently select a time, for example, a few seconds before to begin providing the countdown to a virtual shift (step 830). For a service like Zwift® software, where thousands of riders each day move through a known course or courses, a particular hill or a particular location may be known to be a place where most riders downshift or upshift to a particular gear. The auto shift functionality may know of those locations, and may know the propensities of a given rider. In fact, the auto shift functionality may know that this rider typically shifts to a particular gear at a given location and may initiate an auto-shift to that gear without any intervention even if that rider has a controller, gear shifts, or other mechanism where by the rider may request a shift. This may be a setting that is available to "learn" a rider's preferences and, thereafter, to enable virtual shifting to automatically take place if a rider so desires.

The virtual shifting system may automatically shift or advise a shift if a user has selected this functionality before or during the workout and one or multiple triggers are detected:

Power (watts)— A user may set a desired power (watts) range to stay within a predetermined threshold. The system may downshift if the watts increase above the range and may upshift if the watts decrease below the range This may be desirable, particularly for training purposes, to keep physical output uniform no matter what the virtual scenery or activity being done with the trainer actually is (e.g. up or down hill).

Power (FTP)— A user may set a functional threshold power (FTP) as a zone or threshold to stay within while engaged in the exercise. The functional threshold power is a power measurement of the highest continuous wattage a rider can maintain for an extended period of time (e.g. 45 or 60 minutes). In such a system, the software may perform a virtual downshift if the watts increase above the range and upshift if the watts decrease below the desired range.

Heart Rate (BPM)— A user may set a beats per minute (BMP) range within which to stay. The system may downshift if the user's BPM increase above the desired range and may upshift if the user's BPM decreases below the desired range Heart Rate Max (BPM)— A user may set a heart rate max BMP range to stay within. The system may downshift if the user's BPM increases above the range and may upshift if the user's BPM decrease below the range Cadence (RPM)—A user may set a desired cadence range (as revolutions per minute— RPM) within which to stay. The system may downshift if the user's cadence increases above the range and may upshift if the user's cadence decreases below the range Each of these examples may perform automatic shifting to maintain a certain physical or technical output (e.g. the strain you are riding at (power) or the stress your body is feeling (HR) or the physical performance (cadence)). There may be other alternatives for desired auto-shift prompts. A user may merely wish to keep a desired pace (e.g. speed), to keep up with a group of riders (pace) or to engage in a preprogramed set of FTP, RPM or other characteristic that alters with time over the course of a workout (e.g. ramps up in difficulty or ramps down or varies in a HIIT style workout of exertion and rest in fixed or irregular intervals). Various other characteristics may be used as the bases or the prompts for auto shifting up or down.

If an auto-shift is not necessary ("no" at 823), then the process continues with more engagement in exercise at 810.

If an auto-shift is necessary ("yes" at 825), then the process continues with a countdown to the virtual shift at 830. This countdown is preferably a visual indicator, such as a countdown of numbers on a display, a bar that dwindles from full to empty, or a bar that fills from empty to full to indicate that a shift will occur at the end of that process. It may visually say "countdown to down (or up) shift" or something to that effect. This countdown is intended to provide warning to riders. As is known by most riders, the transition and post-shift period is a bit jarring.

The system may also provide the capability to cancel an auto-shift during this countdown. This may be pressing a button, a quick stop/start of pedaling (for riders without a controller), or merely maintaining the same cadence through the countdown to ensure the shift does not happen. There are various options whereby a rider, with or without a controller, may signal that he or she does not wish for an auto-shift to take place.

Figure 9:
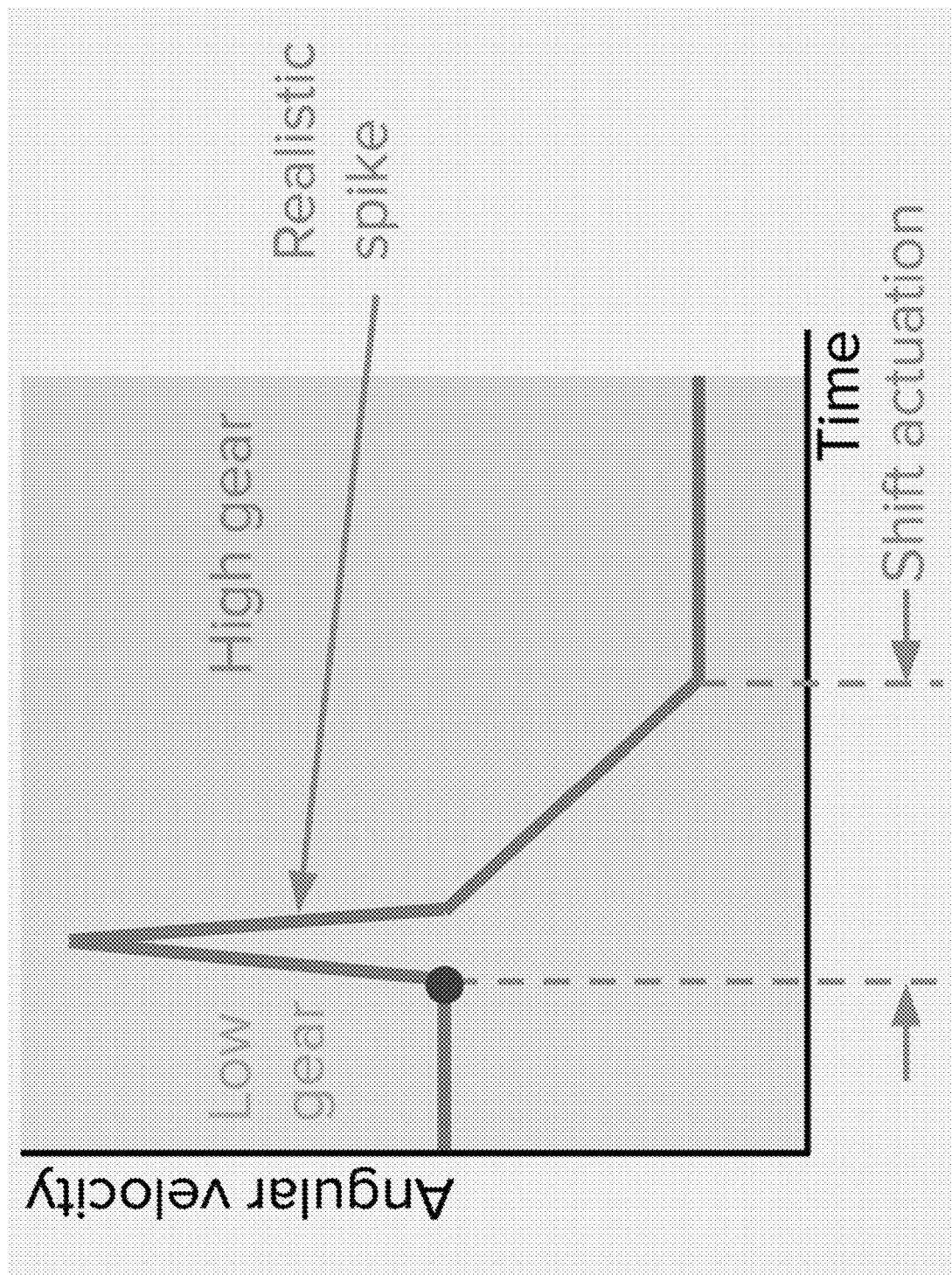
FIG. 9 is an example power curve for a virtual shift.

Following a virtual shift signal ("yes" at 815 or 825), the control device 213 (FIG. 2) instructs the trainer to generate a virtual shift at 840. The virtual shift is a sub-part of virtual gear shifting. At this step, the trainer simulates the actual process of shifting gears. When a downshift happens under strain, there is typically a bit of a rub of the derailleur on the chain (which is friction causing a minor increase in resistance), then a click or clunk while the actual shift happens. For a split second after that click or clunk, the power is reduced dramatically, then re-engages. After the reengagement, the power necessary to continue pedaling is increased or decreased, proportional to the difference in diameter of the two gears being transitioned between. In a typical gear change, this difference would be at least a 10% difference in power necessary between a first gear and a second gear while cycling. An example virtual shift power curve is shown in FIG. 9.

So, to generate the virtual shift at 840, a haptic movement or feedback may be generated. As is known in the art, electric motors with weights affixed are often used to generate "vibrate" haptic movements for, for example, video game controllers. Here, the light resistance change (increased resistance for any gear shift, up or down) of the feel of a derailleur rubbing on the chain can be simulated by the trainer 212 by simply having a bit of a hard shift in resistance, but having the actual resistance shift be minimal. The electromagnet-based trainers can simulate the touch of the chain to the derailleur by quickly reversing, then continuing with slightly less or more resistance, the amount of current applied to the electromagnet. The quick reverse will cause a "click" feel, and the slightly increased current will cause a minor increase in resistance. This can effectively simulate the feel of the beginnings of a gear shift.

Next, the click or clunk of the actual transition down between two gears can be simulated by a slightly-longer reversal (or cessation) of the current to the electromagnet. The rider will feel the sudden change in resistance as a loose pedal for a moment, then "catching" when the resistance is reinitiated. Going up a gear may be simulated by some intermittent grinding as the transition happens, again by rapid reversal and re-initiation of the electromagnet, followed by a lighter resistance. In some cases, an actual brake may be integrated into the trainer itself to facilitate the hard feel of the transitions between gears.

After the virtual gear shift itself, then the new gear may be simulated by adjusting the associated resistance at 850. If the gear was shifted down, then the resistance may be raised by an associated amount. If the gear was shifted up, then the resistance may be lowered by an associated amount. As is known in the art, software such as Zwift® is capable of simulating the smooth transition from low resistance to high resistance as a rider pedals on a straightaway, and then begins pedaling up a hill with a steep grade. The addition of virtual shifting operates in much the same way—as an added variable to the overall resistance applied by a trainer. However, the primary distinction is the "rough" transition between gears that may be simulated by the application of a brake or extremely temporary reversal of current to the electromagnets, and the more-abrupt transition between a first resistance level and a second resistance level simulating the gear change from one gear to another.

The virtual shift at 840 may also be used to simulate a virtual braking of the bicycle. The trainer 212 (FIG. 2) may incorporate an actual brake to quickly slow the resistance device in the trainer (typically a flywheel with electromagnets on its exterior, but in some cases merely a large electromagnet). The trainer 212 may rely upon strong application of counter-current to generate sufficient force to feel to a rider as though a brake is being applied. Brakes are sometimes uneven, particularly if braking is done strongly. Such braking typically has a feel of wobble-wobble-wobble as the brake moves in and out of high and lower effectiveness under extreme braking pressure. This wobble may be simulated in much the same way as a virtual shift at 840. If braking is simulated, the adjusted resistance at step 850 may be unnecessary.

Next, a determination is made at 855 whether the exercise is complete. If so ("yes" at 855), then the process ends at 895. If not ("no" at 855), then the process continues with more engagement in exercise at 810.

Once exercise is complete ("yes" at 855), then the process then ends at 895.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An exercise device for engaging in an exercise, the exercise device comprising:
    a communications interface for receiving instructions from control software controlling operation of the exercise device;
    a resistance device applied to the exercise device for increasing or decreasing resistance for the exercise under control of the control software; and
    the control software operating to generate a simulated haptic movement, using the resistance device, by temporarily altering the resistance applied to the exercise device by the resistance device; wherein the simulated haptic movement is a simulated gear shift or simulated braking, and the temporary alteration to the resistance applied to the exercise device by the resistance device is at least one rapid near-cessation of resistance followed by an increase or reduction in the resistance applied immediately preceding the simulated gear shift or simulated braking.

2. The exercise device of claim 1 further comprising:
    a control device,
    wherein the simulated haptic movement is applied in response to user interaction with the control device via a controller.

3. The exercise device of claim 2 wherein the control device is a selected one of:
    a computing device executing the instructions to cause the control software to operate;
    a computing device paired with a separate computing device executing the instructions to cause the control software to operate; and
    a controller paired with the separate computing device executing the instructions to cause the control software to operate.

4. The exercise device of claim 1 further comprising:
    a display device for presenting a user interface to an operator of the exercise device,
    wherein the display device provides an indicator that the simulated haptic movement will take place prior to the control software generating the simulated haptic movement.

5. The exercise device of claim 4 wherein the indicator is a selected one of: a countdown appearing on the display device prior to the simulated haptic movement and a tachometer indicating a particular revolutions per minute (RPM) at which point a downshift or upshift will occur.

6. The exercise device of claim 1 wherein the simulated haptic movement is a simulated gear shift and the temporary alteration to the resistance applied to the exercise device by the resistance device is at least one rapid near-cessation of resistance followed by a reduction of at least 10% in the resistance applied immediately preceding the simulated gear shift.

7. The exercise device of claim 6 wherein after the simulated haptic movement, an adjusted resistance, distinct from a resistance applied immediately preceding the simulated haptic movement, is applied to simulate a newly-selected gear following the simulated gear shift.

8. The exercise device of claim 1 wherein the resistance device further comprises a trainer incorporating a single sprocket receiver for receiving a sprocket mounted to the exercise device for securely coupling the resistance device to pedals and a crank of the exercise device at a single sprocket mount.

9. The exercise device of claim 8 wherein the exercise device is a cycle which further comprises an axle, mountable to a fork of the cycle, incorporating the single sprocket to be coupled to the resistance device at the single sprocket receiver.

10. The exercise device of claim 1 wherein the exercise device comprises a stationary cycle.

11. A method for virtual shifting while engaging in exercise, the method comprising:
   receiving instructions over a communications interface from control software controlling operation of an exercise device;
   controlling resistance to the exercise applied to the exercise device by a resistance device, the resistance device increasing or decreasing resistance for the exercise under control of the control software; and
   generating a simulated haptic movement, as instructed by the control software and using the resistance device, by altering the resistance applied to the exercise device by the resistance device; wherein the simulated haptic movement is a simulated gear shift or simulated braking, and the temporary alteration to the resistance applied to the exercise device by the resistance device is at least one rapid near-cessation of resistance followed by an increase or reduction in the resistance applied immediately preceding the simulated gear shift or simulated braking.

12. The method of claim 11 wherein the simulated haptic movement is applied in response to user interaction with a controller.

13. The method of claim 12 further comprising:
   presenting on a display device a user interface to an operator of the exercise device,
   wherein the display device provides an indicator that the simulated haptic movement will take place prior to the control software generating the simulated haptic movement.

14. The method of claim 13 wherein the indicator is a selected one of: a countdown appearing on the display device prior to the simulated haptic movement and a tachometer indicating a particular revolutions per minute (RPM) at which point a downshift or upshift will occur.

15. The method of claim 11 wherein the simulated haptic movement is a simulated gear shift and the temporary alteration to the resistance applied to the exercise device by the resistance device is at least one rapid near-cessation of resistance followed by a reduction of at least 10% in the resistance applied immediately preceding the simulated gear shift.

16. The method of claim 15 wherein after the simulated haptic movement, an adjusted resistance, distinct from a resistance applied immediately preceding the simulated haptic movement, is applied to simulate a newly-selected gear following the simulated gear shift.

17. The method of claim 11:
   wherein the exercise device is a cycle; and
   wherein the resistance device further comprises a trainer incorporating a single sprocket receiver for receiving a sprocket mounted to the cycle for securely coupling the resistance device to pedals and a crank of the bicycle at a single sprocket mount; and
   wherein the cycle further comprises a fork and an axle mountable to the fork, the axle incorporating the single sprocket coupled to the resistance device at the single sprocket receiver.

18. A system for engaging in an exercise, the system comprising:
   a bicycle;
   a communications interface for receiving instructions from control software controlling operation of the bicycle;
   a trainer, coupled to the bicycle by a single sprocket, for generating a first resistance to the exercise applied to the bicycle, the trainer increasing or decreasing resistance for the exercise under control of the control software; and
   the control software operating to:
      generate a simulated haptic movement, using the resistance device, by temporarily altering resistance applied to the bicycle by the resistance device to simulate the initiation of a virtual gearshift; wherein the temporary alteration to the resistance includes at least one rapid near-cessation of resistance and
      instruct the trainer to alter the resistance applied to the bicycle from the first resistance immediately preceding the virtual gear shift to a second resistance applied to the bicycle immediately following the virtual gear shift.

* * * * *